USO12095463B1

(12) United States Patent
Tang et al.

(10) Patent No.: US 12,095,463 B1
(45) Date of Patent: Sep. 17, 2024

(54) METHOD AND APPARATUS FOR SHARING CLOCKS BETWEEN SEPARATE INTEGRATED CIRCUIT CHIPS

(71) Applicant: Marvell Asia Pte Ltd, Singapore (SG)

(72) Inventors: Xiaofeng Tang, Shanghai (CN); Gongqiong Li, Shanghai (CN); Hongwei Dai, Shanghai (CN)

(73) Assignee: Marvell Asia Pte Ltd, Singapore (SG)

( * ) Notice: Subject to any disclaimer, the term of this patent is extended or adjusted under 35 U.S.C. 154(b) by 13 days.

(21) Appl. No.: 17/819,407

(22) Filed: Aug. 12, 2022

Related U.S. Application Data

(60) Provisional application No. 63/233,188, filed on Aug. 13, 2021.

(51) Int. Cl.
| | | |
|---|---|---|
| *H03K 3/01* | (2006.01) | |
| *G06F 1/06* | (2006.01) | |
| *H01L 25/00* | (2006.01) | |
| *H01L 25/065* | (2023.01) | |

(52) U.S. Cl.
CPC ............. *H03K 3/01* (2013.01); *G06F 1/06* (2013.01); *H01L 25/0655* (2013.01); *H01L 25/50* (2013.01)

(58) Field of Classification Search
CPC ......... H03K 3/01; G06F 1/06; H01L 25/0655; H01L 25/50
See application file for complete search history.

(56) References Cited

U.S. PATENT DOCUMENTS

| | | | |
|---|---|---|---|
| 9,490,787 B1 * | 11/2016 | Kho | H03K 5/135 |
| 9,865,503 B2 | 1/2018 | Rotem et al. | |
| 10,509,104 B1 * | 12/2019 | Dato | G01S 13/87 |
| 10,622,317 B2 | 4/2020 | Tatour et al. | |
| 2008/0074205 A1 * | 3/2008 | Chen | G06F 1/08 331/74 |
| 2012/0126907 A1 | 5/2012 | Nakamoto et al. | |
| 2019/0006990 A1 | 1/2019 | Marques et al. | |
| 2019/0041895 A1 * | 2/2019 | Miao | H01L 25/0657 |
| 2021/0104484 A1 * | 4/2021 | Jha | H01L 23/3128 |

FOREIGN PATENT DOCUMENTS

CN      2864995 Y   *   1/2007

* cited by examiner

*Primary Examiner* — Metasebia T Retebo
*Assistant Examiner* — James G Yeaman

(57) ABSTRACT

An integrated circuit device includes a plurality of integrated circuit chips located on a common substrate, each respective integrated circuit chip from among the plurality of integrated circuit chips including functional circuitry, a clock generator, clock circuitry including clock terminals at an edge of the respective integrated circuit chip, initial clock conductors configured to conduct a clock signal output by the clock generator from the clock generator to the clock terminals, and functional clock conductors configured to conduct the clock signal from the clock terminals to the functional circuitry. Each respective chip is located on the common substrate in an orientation that exposes the clock terminals on the respective chip to face corresponding clock terminals on at least one other chip among the plurality of integrated circuit chips, configured for interconnection of the plurality of integrated circuit chips into a multi-chip module with a common clock.

30 Claims, 7 Drawing Sheets

METHOD AND APPARATUS FOR SHARING CLOCKS BETWEEN SEPARATE INTEGRATED CIRCUIT CHIPS

CROSS REFERENCE TO RELATED APPLICATION

This disclosure claims the benefit of commonly-assigned U.S. Provisional Patent Application No. 63/233,188, filed Aug. 13, 2021, which is hereby incorporated by reference herein in its entirety.

FIELD OF USE

This disclosure relates to inter-chip connections in a multi-chip module. More particularly, this disclosure relates to integrated circuits including an interface for providing clock signals between individual chips in a multi-chip module.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Certain high-capacity devices, such as, for example, high-capacity, high-speed network switches, high-performance computing devices, or artificial intelligence devices, may rely on multi-chip architectures in which multiple dies are located on a single substrate and/or in a single package. Insofar as such devices are clocked, a clock signal should be distributed, to all dies within the multi-chip device, with as little clock variation as possible. Typically, distribution of clock signals (along with data signals) for such devices has been accomplished using ultra-short-reach high-speed serializer-deserializer circuits, which are expensive in terms of both power and device area. Alternatives may include lower-speed serial interfaces such as JTAG, MDIO, etc., but those are generally suitable only for configuration and debugging. In some situations, a parallel interface has been used, but those also support only lower speeds.

SUMMARY

In accordance with implementations of the subject matter of this disclosure, an integrated circuit device includes a plurality of integrated circuit chips located on a common substrate, each respective integrated circuit chip from among the plurality of integrated circuit chips including functional circuitry, a clock generator, clock circuitry including clock terminals at an edge of the respective integrated circuit chip, initial clock conductors configured to conduct a clock signal output by the clock generator from the clock generator to the clock terminals, and functional clock conductors configured to conduct the clock signal from the clock terminals to the functional circuitry. Each respective chip is located on the common substrate in an orientation that exposes the clock terminals on the respective chip to face corresponding clock terminals on at least one other chip among the plurality of integrated circuit chips, configured for interconnection of the plurality of integrated circuit chips into a multi-chip module with a common clock.

In a first implementation of such an integrated circuit device, the clock circuitry may lack functional circuitry between the clock terminals and a physical edge of the respective integrated circuit chip.

A second implementation of such an integrated circuit device may further include connector metallizations in upper metal layers of the integrated circuit device configured to couple each clock terminal on the respective chip to another clock terminal on the respective chip, and to selectably (a) couple each clock terminal on the at least one other chip to another clock terminal on the at least one other chip, whereby each respective chip is clocked independently by its respective clock generator, or (b) couple a clock terminal on each of the at least one other chip to a clock terminal on the respective chip, whereby the respective chip and each of the at least one other chip are clocked by the clock generator of the respective chip.

According to a first aspect of that second implementation, each of the at least one other chip may be separated from the respective chip by a separation distance that minimizes clock jitter between clock signals on the respective chip and clock signals each of the at least one other chip when the connector metallizations are configured to couple the clock terminal on each of the at least one other chip to the clock terminal on the respective chip, and the respective chip and each of the at least one other chip are clocked by the clock generator of the respective chip.

In one instance of that first aspect, the separation distance may be about 80 μm.

According to a second aspect of that second implementation, the at least one other chip may be exactly one other chip, the respective chip and the one other chip forming a group of two chips configurable by the connector metallizations as one of (a) two single-chip modules, and (b) one dual-chip module.

According to a third aspect of that second implementation, the at least one other chip may be a plurality of other chips, the respective chip and the plurality of other chips forming a group of chips configurable by the connector metallizations as one of (a) a plurality of single-chip modules, and (b) one multi-chip module.

In a first instance of that third aspect, the plurality of other chips may include three other chips, and the respective chip and the three other chips are identical and form a group of chips configurable by the connector metallizations as one of (a) four single-chip modules, and (b) one four-chip module.

In a second instance of that third aspect, the plurality of other chips may include at least seven other chips, each chip of the respective chip and the plurality of other chips having a plurality of sets of clock terminals, each set of clock terminals on one chip being on a different edge of the one chip, and the respective chip and the plurality of other chips form a group of chips configurable by the connector metallizations as one of (a) a plurality of single-chip modules, and (b) one multi-chip module.

In a first variant of that second instance, all chips in the respective chip and the at least seven other chips may be identical, having an identical number of sets of clock terminals.

In a second variant of that second instance, each chip in a first subset of the respective chip and the at least seven other chips may have a first number of sets of clock terminals, and each chip in a second subset of the respective chip and the at least seven other chips may have a second number of sets of clock terminals different from the first number of sets of clock terminals.

In accordance with implementations of the subject matter of this disclosure, an intermediate integrated circuit product includes a plurality of integrated circuit chips located on a common substrate, each respective integrated circuit chip from among the plurality of integrated circuit chips including functional circuitry, a clock generator, clock circuitry including clock terminals at an edge of the respective integrated circuit chip, initial clock conductors configured to conduct a clock signal output by the clock generator from the clock generator to the clock terminals, and functional clock conductors configured to conduct the clock signal from the clock terminals to the functional circuitry. Each respective chip is located on the common substrate in an orientation that exposes the clock terminals on the respective chip to face corresponding clock terminals on at least one other chip among the plurality of integrated circuit chips. The intermediate integrated circuit product is configured to have each clock terminal on the respective chip coupled by upper-layer connector metallizations to another clock terminal on the respective chip, and to selectably (a) have each clock terminal on the at least one other chip be coupled by upper-layer connector metallizations to another clock terminal on the at least one other chip, to form an integrated circuit device in which each respective chip is clocked independently by its respective clock generator, or (b) have a clock terminal on each of the at least one other chip coupled by upper-layer connector metallizations to a clock terminal on the respective chip, to form an integrated circuit device in which the respective chip and each of the at least one other chip are clocked by the clock generator of the respective chip.

In a first implementation of such an intermediate integrated circuit product, the clock circuitry may lack functional circuitry between the clock terminals and a physical edge of the respective integrated circuit chip.

In a second implementation of such an intermediate integrated circuit product, each of the at least one other chip may be separated from the respective chip by a separation distance that minimizes clock jitter between clock signals on the respective chip and clock signals each of the at least one other chip when the connector metallizations are configured to couple the clock terminal on each of the at least one other chip to the clock terminal on the respective chip, and the respective chip and each of the at least one other chip are clocked by the clock generator of the respective chip.

According to a first aspect of that second implementation, the separation distance may be about 80 μm.

In a second implementation of such an intermediate integrated circuit product, the at least one other chip may be exactly one other chip, the respective chip and the one other chip forming a group of two chips configurable by the connector metallizations as one of (a) two single-chip modules, and (b) one dual-chip module.

In a third implementation of such an intermediate integrated circuit product, the at least one other chip may be a plurality of other chips, the respective chip and the plurality of other chips forming a group of chips configurable by the connector metallizations as one of (a) a plurality of single-chip modules, and (b) one multi-chip module.

According to a first aspect of that third implementation, the plurality of other chips may include three other chips, the respective chip and the three other chips being identical and forming a group of chips configurable by the connector metallizations as one of (a) four single-chip modules, and (b) one four-chip module.

According to a second aspect of that third implementation, the plurality of other chips may include at least seven other chips, each chip of the respective chip and the plurality of other chips having a plurality of sets of clock terminals, each set of clock terminals on one chip being on a different edge of the one chip, and the respective chip and the plurality of other chips may form a group of chips configurable by the connector metallizations as one of (a) a plurality of single-chip modules, and (b) one multi-chip module.

In a first instance of that second aspect, all chips in the respective chip and the at least seven other chips may be identical, having an identical number of sets of clock terminals.

In a second instance of that second aspect, each chip in a first subset of the respective chip and the at least seven other chips may have a first number of sets of clock terminals, and each chip in a second subset of the respective chip and the at least seven other chips may have a second number of sets of clock terminals different from the first number of sets of clock terminals.

In accordance with implementations of the subject matter of this disclosure, a method of fabricating an integrated circuit device includes forming a plurality of integrated circuit chips on a common substrate, each respective integrated circuit chip from among the plurality of integrated circuit chips including functional circuitry, a clock generator, and clock circuitry including clock terminals at an edge of the respective integrated circuit chip, initial clock conductors configured to conduct a clock signal output by the clock generator from the clock generator to the clock terminals, and functional clock conductors configured to conduct the clock signal from the clock terminals to the functional circuitry, positioning each respective chip on the common substrate in an orientation that exposes the clock terminals on the respective chip to face corresponding clock terminals on at least one other chip among the plurality of integrated circuit chips, coupling each clock terminal on the respective chip by upper-layer connector metallizations to another clock terminal on the respective chip, and (a) coupling each clock terminal on the at least one other chip by upper-layer connector metallizations to another clock terminal on the at least one other chip, to form an integrated circuit device in which each respective chip is clocked independently by its respective clock generator, or (b) coupling a clock terminal on each of the at least one other chip by upper-layer connector metallizations to a clock terminal on the respective chip, to form an integrated circuit device in which the respective chip and each of the at least one other chip are clocked by the clock generator of the respective chip.

A first implementation of such a method may include forming the clock circuitry without functional circuitry between the clock terminals and a physical edge of the respective integrated circuit chip.

A second implementation of such a method may include separating each of the at least one other chip from the respective chip by a separation distance that minimizes clock jitter between clock signals on the respective chip and clock signals each of the at least one other chip when clock terminal on each of the at least one other chip are coupled by the upper-layer connector metallizations to the clock terminal on the respective chip.

According to a first aspect of that first implementation, separating each of the at least one other chip from the respective chip may include separating each of the at least one other chip from the respective chip by about 80 μm.

In a third implementation of such a method, forming a plurality of integrated circuit chips may include forming respective pairs of chips configurable by the connector metallizations as one of (a) two single-chip modules, and (b) one dual-chip module.

In a fourth implementation of such a method, forming a plurality of integrated circuit chips may include forming the respective chip and a plurality of other chips as a group of chips configurable by the connector metallizations as one of (a) a plurality of single-chip modules, and (b) one multi-chip module.

According to a first aspect of that fourth implementation, forming the respective chip and the plurality of integrated circuit chips may include forming the respective chip and three other chips, the respective chip and the three other chips being identical and forming a group of chips configurable by the connector metallizations as one of (a) four single-chip modules, and (b) one four-chip module.

According to a second aspect of that fourth implementation, forming the respective chip and the plurality of integrated circuit chips may include forming the respective chip and at least seven other chips, each chip of the respective chip and the plurality of other chips having a plurality of sets of clock terminals, each set of clock terminals on one chip being on a different edge of the one chip, and the respective chip and the at least seven other chips forming a group of chips configurable by the connector metallizations as one of (a) a plurality of single-chip modules, and (b) one multi-chip module.

A first instance of that second aspect may include forming all chips in the respective chip and the at least seven other chips identically, with an identical number of sets of clock terminals.

A second instance of that second aspect may include forming each chip in a first subset of the respective chip and the at least seven other chips with a first number of sets of clock terminals, and forming each chip in a second subset of the respective chip and the at least seven other chips with a second number of sets of clock terminals different from the first number of sets of clock terminals.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
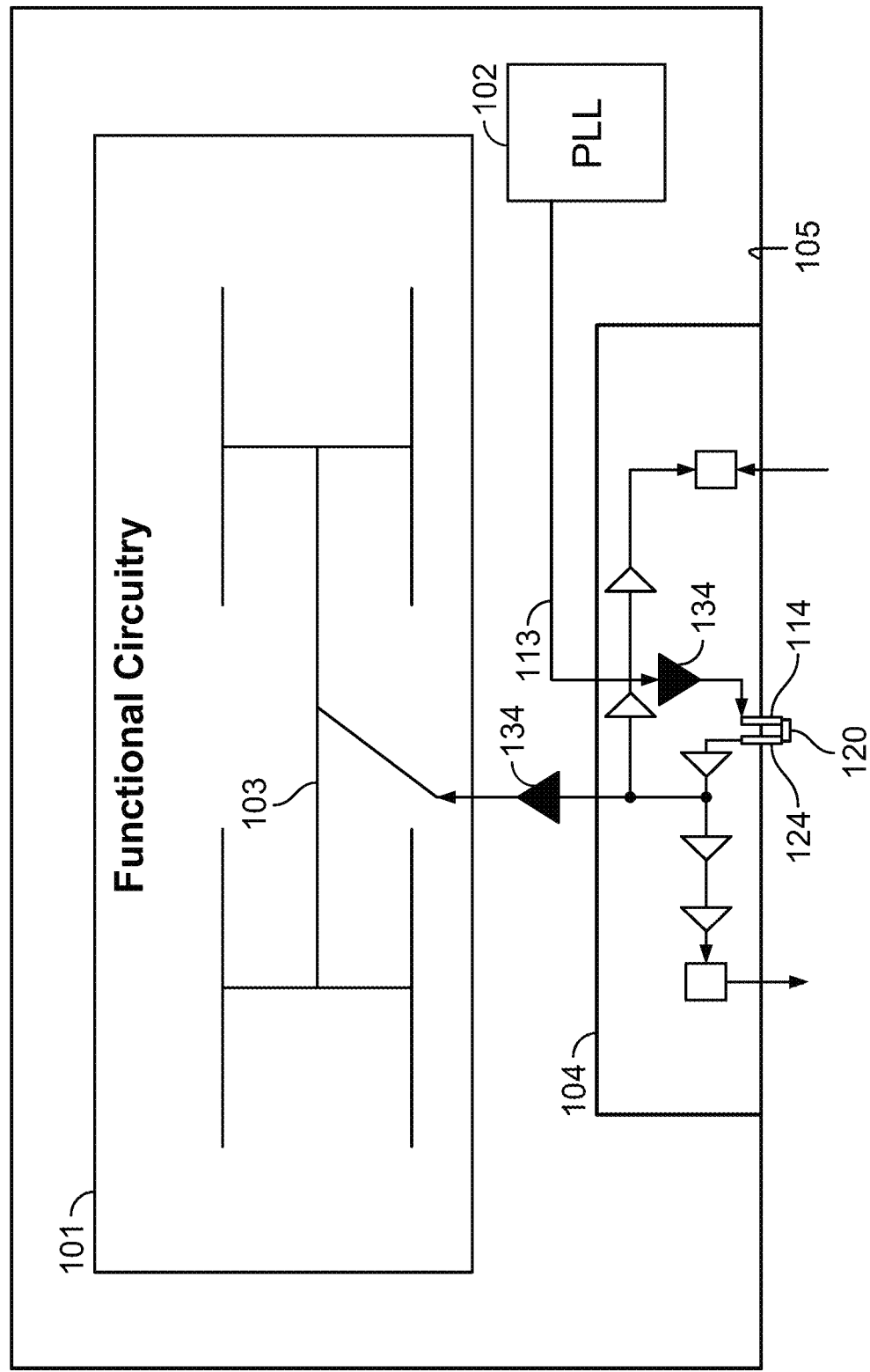
FIG. 1 is a simplified representation of a type of integrated circuit chip that may be fabricated in accordance with implementations of the subject matter of this disclosure.

In some typical implementations, high-capacity devices, such as, for example, high-capacity, high-speed network switches, high-performance computing devices, or artificial intelligence devices, may rely on multi-chip architectures in which multiple chips are located on a single substrate and/or in a single package. Insofar as such devices are clocked, a clock signal should be distributed, to all chips within the multi-chip device, with as little clock variation as possible.

In many instances, individual chips, such as those that are used together in a high-performance multi-chip architecture such as those described above, also may be used separately in low-performance or medium-performance applications. Therefore, each chip may have its own clock source, and also may have a clock distribution network (e.g., a clock tree such as an H-tree) to minimize clock skew across the chip. However, when two or more chips are used together as a "dual-chip module" or "multi-chip module," a single clock source is used in some implementations to maintain synchronization, and avoid jitter or clock variation, across the dual-chip module or multi-chip module.

The following description focuses primarily on implementations in which multiple chips are formed on a single wafer, and can be used as individual chips (sometimes referred to as "individual dies" or "single dies") or as dual-chip or multi-chip modules. Using typical semiconductor fabrication techniques, multiple individual chips ("single-die modules") are formed on a semiconductor wafer, with "scribe lines" provided where the wafer can be diced to separate the individual chips into individual or "simple" dies. To form a dual-chip or multi-chip module, some of those scribe lines would not be diced, so that dies including two, or several, chips, as described below, are formed. Such dies may be referred to as "complex" or "combo" dies.

However, the principles of the subject matter of this disclosure, including the claims which follow, also may be implemented by forming multiple individual dies and then mounting them, using available semiconductor processing or packaging techniques, on a common substrate and/or within a single package, as long as they are separated by distances that are comparable to the separation distances between individual dies that are formed from a single wafer.

Typically, clock signal distribution for dual-chip modules or multi-chip modules has been accomplished using ultra-short-reach high-speed serializer-deserializer circuits, which are expensive in terms of both power and device area. Alternatives may include lower-speed serial interfaces such as JTAG, MDIO, etc., but those are generally suitable only for configuration and debugging. In some situations, a parallel interface has been used, but those also support only lower speeds. The circuitry of such connections also may contribute to jitter or clock variation from one chip in the multi-chip module to another chip in the multi-chip module.

Therefore, in accordance with implementations of the subject matter of this disclosure, short direct-wire connections between chips are used to conduct the clock signal from one chip (which may be referred to as a "leader" chip) to another chip (which may be referred to as a "follower" chip), or to multiple other chips (all of which may be referred to as "follower" chips), when two or more chips are used together as a single module. To minimize the length of the short direct-wire connections, the individual chips may be fabricated en masse on single wafer or substrate. The chips may then be diced from the wafer individually if they are to be used as single-chip modules, or in groups if they are to be used as multi-chip modules. The separation distance between the individual dies on the wafer should be the large enough to allow the individual chips to be diced apart, but may be the smallest distance that allows individual dicing so that when the individual chips are not diced individually, but in groups for multi-chip modules, the direct-wire connections are as short as possible.

To further minimize the length of the direct-wire connections, clock connections for each chip are exposed at an edge of the chip. Moreover, rather than fabricating every chip on the wafer or substrate in the same orientation, adjacent chips are fabricated so that their clock connections (which may be part of a larger chip-to-chip interface for other signals in addition to clock signals) face other. For example, if the chips are to be used as a dual-chip modules, the chips may be fabricated in a pattern in which each chip is rotated 180° relative to the chips adjacent each side of that chip. That is, considering any row or column of chips, the orientation of the chips in that row or column alternate by 180° as one progresses from chip to chip within the row or column. Such a pattern results in pairs of chips in which the chip-to-chip interface of a first chip faces the chip-to-chip interface of the second chip. The wafer or substrate can be diced into units of those pairs, for use as a dual-chip module, or can diced into individual dies for use as single-chip modules (or left on the single substrate but used individually).

In other implementations, chip arrangements for multi-chip modules including more than two chips may be provided. For example, a four-chip module may be provided for by forming the chip-to-chip interface in the corner of each chip, and arranging the chips in a pattern in which, in each group of four chips, the four corners bearing the chip-to-chip interfaces meet in the center of the four-chip arrangement. Multi-chip modules including more than four chips are also possible, as described below.

Integrated circuit devices typically include multiple metallization layers, alternating with dielectric or insulating layers as necessary, over a substrate of semiconductor material (e.g., silicon, gallium arsenide, etc.) in which circuit elements may be formed (in some implementations, there may be additional semiconductor layers as well). In accordance with another aspect of the subject matter of this disclosure, the inter-chip clock connections may be made using upper metallization layers (i.e., among the last metallization layers to be applied) of the integrated circuit device. This allows the same processing steps to be used to fabricate integrated circuit wafers to form single-chip modules or to form multi-chip modules, changing only the steps to form the upper metallization layers depending on whether single-chip modules or multi-chip modules are desired. More importantly, the same photolithographic masks may be used to create all of the layers up until the upper level metallization layers, resulting in substantial cost savings.

Moreover, in some implementations, the semiconductor wafer may be formed as an intermediate semiconductor product without the upper metallization layers. The intermediate semiconductor product may kept in stock until a customer orders either single-chip modules or multi-chip modules, at which time the additional upper metallization layers may be added to form the final semiconductor product.

The subject matter of this disclosure may be better understood by reference to FIGS. 1-7.

FIG. 1 is a simplified representation of a type of integrated circuit chip 100 that may be fabricated in accordance with implementations of the subject matter of this disclosure. Integrated circuit chip 100 has some functional circuitry 101, as well as a clock source 102, which may, for example, be a phase-locked loop (PLL). Clock signals from clock source 102 are distributed to all portions of functional circuitry 101 using a specialized clock-tree layout 103 (e.g., an H-tree) that results in the clock signals traversing nearly the same distance over integrated circuit chip 100 regardless of the location of the circuit element destination of the clock signals, minimizing clock skew across integrated circuit chip 100. The distance from clock source 102 to the base of clock tree 103 does not affect clock skew, because all clock signals must traverse that distance.

Therefore, in accordance with implementations of the subject matter of this disclosure, integrated circuit chip 100 includes an inter-chip interface 104 at an edge 105 of integrated circuit chip 100. Clock path 113 may be routed through inter-chip interface 104 to a pair of clock terminals 114, 124 at edge 105. The space between clock terminals 114, 124 forms a gap in clock path 113. If integrated circuit chip 100 is to be used alone—i.e., as a simple die or single-chip module—then connector metallization 120 may be applied to couple clock terminal 124 to clock terminal 114, completing clock path 113, which then continues to the base of clock tree 103, allowing clock signals to propagate to functional circuitry 101. The distance added to clock path 113 by detouring through inter-chip interface 104 does not contribute to clock variation or skew, because all clock signals traverse that part of clock path 113 prior to reaching the base of clock tree 103.

Figure 2:
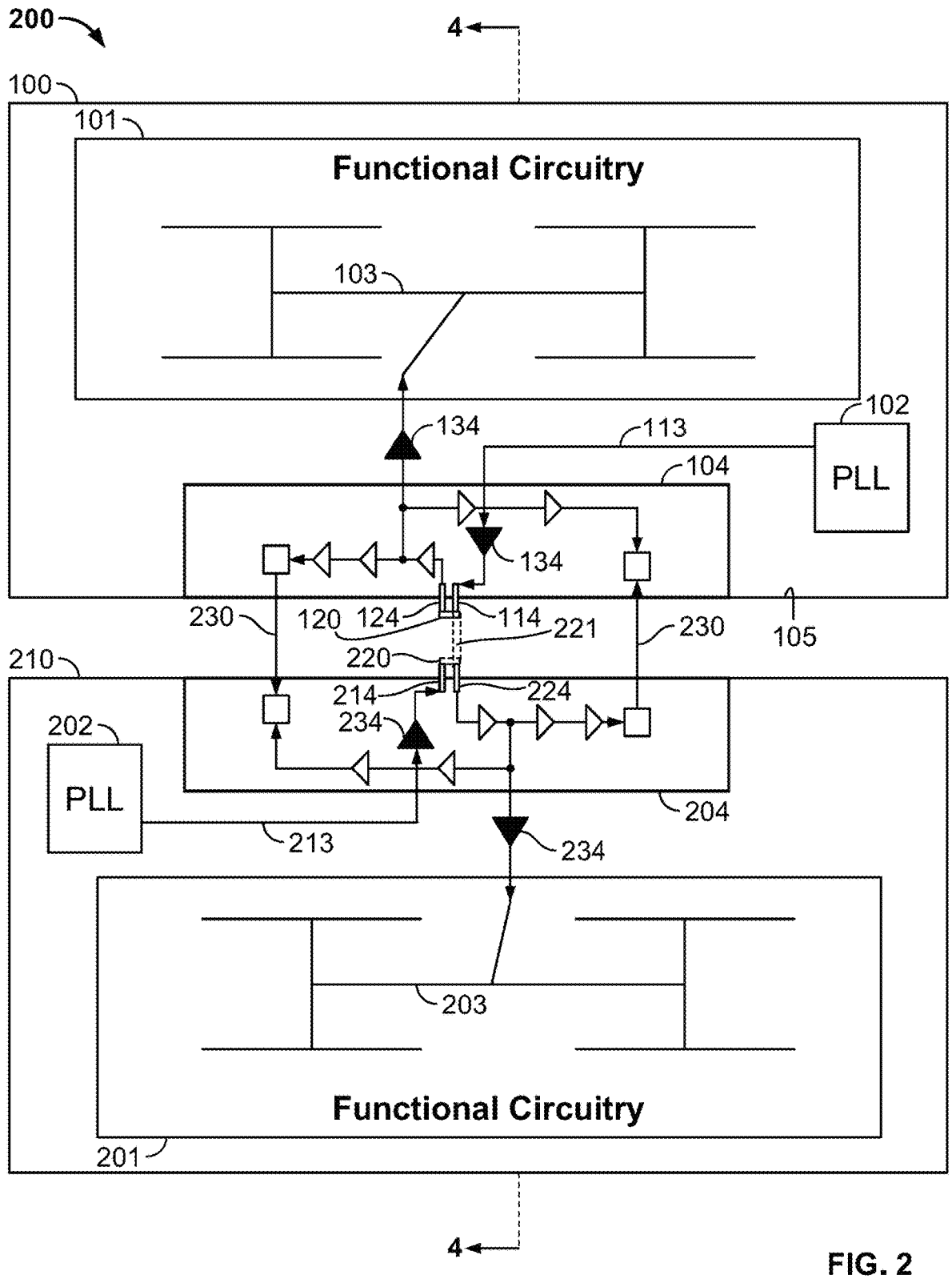
FIG. 2 is a plan view of two integrated circuit chips arranged for use as a dual-chip module in accordance with implementations of the subject matter of this disclosure.

However, integrated circuit chip 100 also may be used as part of a complex die or multi-chip module (e.g., a dual-chip module), and a multi-chip (i.e., dual-chip) module 200 is illustrated in FIG. 2. Multi-chip module 200 includes integrated circuit chip 100, as well as integrated circuit chip 210, which may be nearly identical to integrated circuit chip 100 except that, inter alia, integrated circuit chip 210 is oriented so that inter-chip interface 204 of integrated circuit chip 210 faces inter-chip interface 104 of integrated circuit chip 100.

If integrated circuit chip 210 is to be used as a single-chip module, then, as in the case of integrated circuit chip 100, connector metallization 220 may be applied to couple clock terminal 224 to clock terminal 214, completing clock path 213 and allowing clock signals to propagate from clock source 202 to functional circuitry 201. However, if integrated circuit chip 210 is to be used with integrated circuit chip 100 as part of a dual-chip module, then only one of clock sources 102, 202 would be used. In such a case, clock terminal 214 is left floating, so that clock signals generated by clock source 202 do not propagate through integrated circuit chip 210. A connector metallization or "wire" connection 221 is made across the gap between integrated circuit chip 100 and integrated circuit chip 210 from clock terminal 114 to clock terminal 224, interconnecting clock path 113 and clock path 213 including clock trees 103, 203. Although both connector metallization 220 and connector metallization 221 are shown in FIG. 2, only one of connector metallization 220 and connector metallization 221 will be present depending on whether two single-chip modules or one dual-chip module are being implemented; therefore both connector metallization 220 and connector metallization 221 are shown in phantom.

The clock path from terminal 114 through clock tree 203 is slightly longer than the clock path from terminal 114 through clock tree 103 by the amount that the inter-chip distance of connector metallization 221 exceeds the inter-terminal distance of connector metallization 120, 220. However, that difference does not contribute any significant clock variation or skew, which may be compensated for by buffers 134, 234 in inter-chip interfaces 104, 204. For example, in one implementation, the inter-terminal distance of connector metallization 120 may be about 1-2 μm while the inter-chip distance of connector metallization 221 may be about 80 μm, with a resulting a path length difference of 78-79 μm. Skew resulting from such a path length difference is well within the buffering capacity of typical clock buffers which may be provided as buffers 134, 234. While in that example, the separation distance is about two orders of magnitude larger than the inter-terminal distance of the clock terminals of interface 104, 204, there is no particular predetermined relationship between the separation distance and the inter-terminal distance. More generally, the separation distance between dies may be determined by the minimum die separation distance that can be achieved using available die fabrication techniques. Buffers 134, 234 would be expected to be sufficient to compensate for minimum separation distances achievable using currently available die fabrication techniques and any smaller separation distances that might be achievable in the future.

For completeness of description, as depicted, inter-chip interfaces 104, 204 include additional circuitry for the transport of data signals 230, in addition to clock signals, between integrated circuit chip 100 and integrated circuit chip 210.

Figure 3:
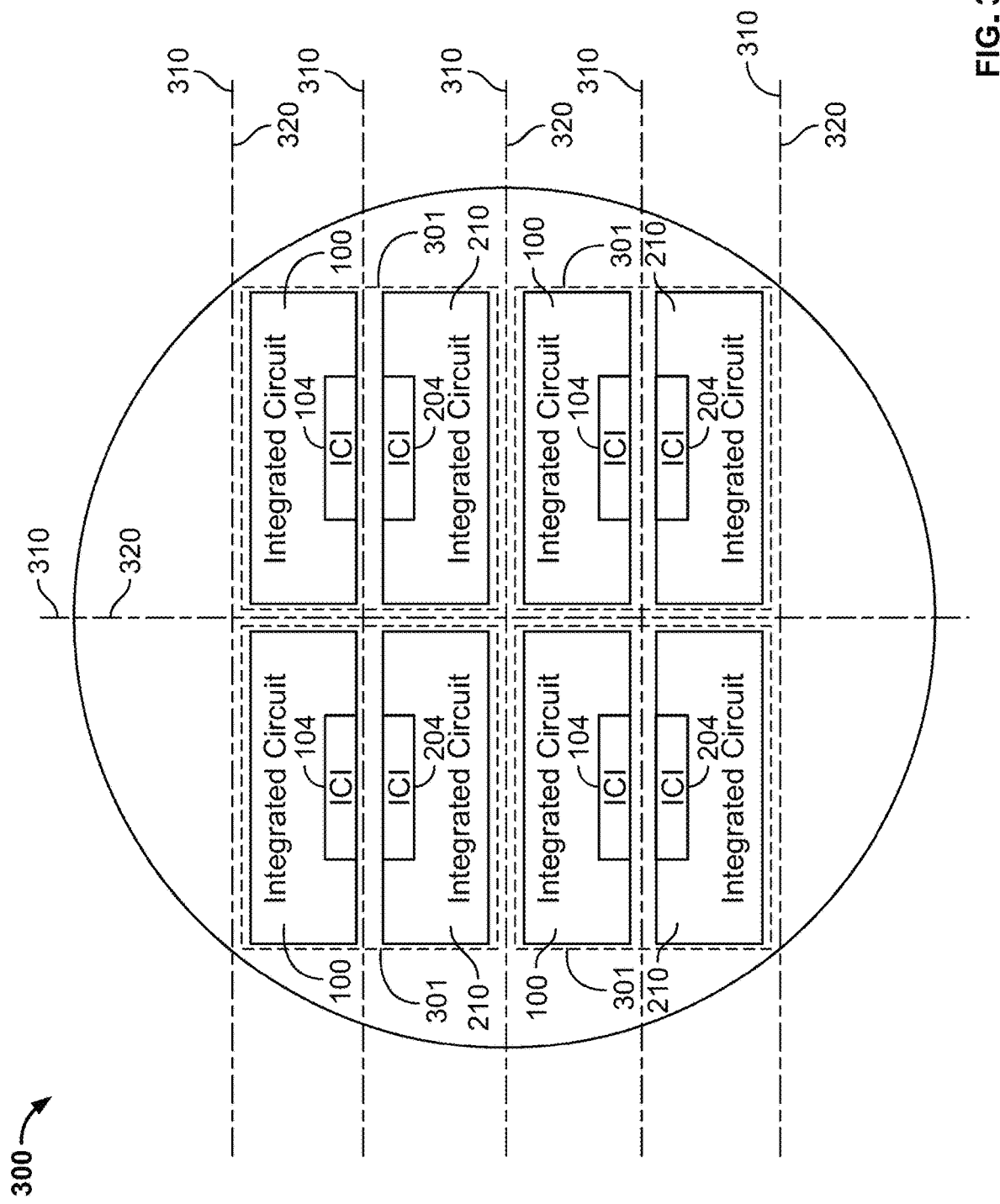
FIG. 3 is a simplified plan view of a semiconductor wafer incorporating integrated circuit chips arranged in accordance with implementations of the subject matter of this disclosure.

FIG. 3 is a simplified plan view of a semiconductor wafer 300 which may include various layers (FIG. 4) of semiconductor material (including actual semiconductor layers as well as metallization layers and, in some cases, insulating or dielectric layers). Multiple copies of integrated circuit chip 100 and integrated circuit chip 210 are arranged on wafer 300, in units 301 that include one integrated circuit chip 100 and one integrated circuit chip 210 with their inter-chip interfaces (ICIs) 104, 204 facing each other. Integrated circuit chips 100 and integrated circuit chips 210 may be used as individual single-chip modules, in which case they may be diced apart individually (e.g., along scribe lines 310). Alternatively, the units 301 each containing one integrated circuit chip 100 and one integrated circuit chip 210 may be used as dual-chip modules, in which case they may be diced apart as units (e.g., along scribe lines 320, which are a subset of scribe lines 310). Although only four units 301, containing a total of eight integrated circuit devices 100, 210 are shown on wafer 300, that illustration is a simplification for drawing purposes, and in practice an actual wafer may include a large number (e.g., hundreds) of integrated circuit devices.

Figure 4:
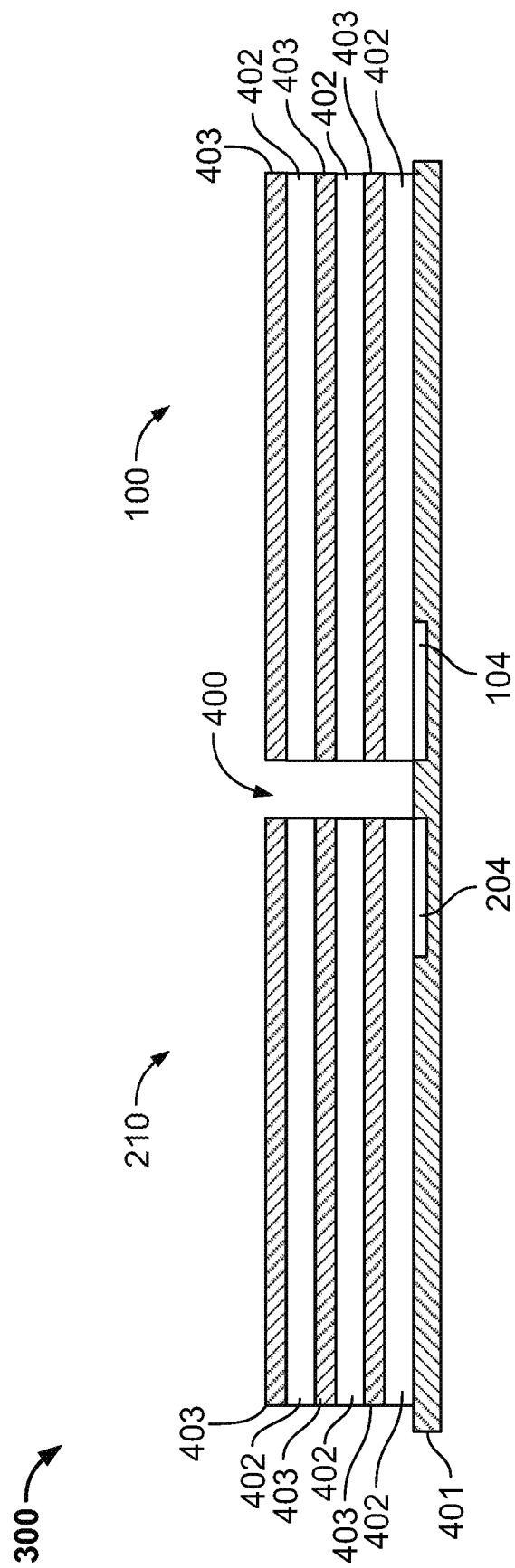
FIG. 4 is a cross-sectional view of a semiconductor wafer, such as the semiconductor wafer of FIG. 3, incorporating the subject matter of this disclosure.

FIG. 4 shows a cross-sectional view, taken from line 4-4 of FIG. 2, of integrated circuit chip 100 and integrated circuit chip 210. The void 400 between integrated circuit chip 100 and integrated circuit chip 210 also is filled by the materials of wafer 300, but those materials are omitted from void 400 in FIG. 4 for clarity. As can be seen, semiconductor layer 401 and various metallization layers 402 are separated by various insulating or dielectric layers 403. Circuitry may be formed in semiconductor layer 401 and interconnected using metallization layers 402 (vias allowing the different metallization layers 402 to be coupled to circuit elements in semiconductor layer 401 are omitted for clarity). Semiconductor layer 401 may include inter-chip interfaces 104, 204. In this view, wafer 300 is an incomplete intermediate semiconductor product, awaiting the application of the uppermost metallization layer or layers to complete the interconnections (e.g., connections 120, 220) of various circuits in the semiconductor layers, including inter-chip connections (e.g., connection 221), if used, between integrated circuit chip 100 and integrated circuit chip 210.

Application to the wafer structure of FIG. 4 of the upper metallization layer or layers, including inter-terminal connector metallization 120 to couple clock source 102 to clock tree 103, as well as either inter-terminal connector metallization 220 to couple clock source 203 to clock tree 203 or inter-chip connector metallization 221 to couple clock source 102 to clock tree 203 results in the structure shown in FIG. 2, previously described.

Figure 5:
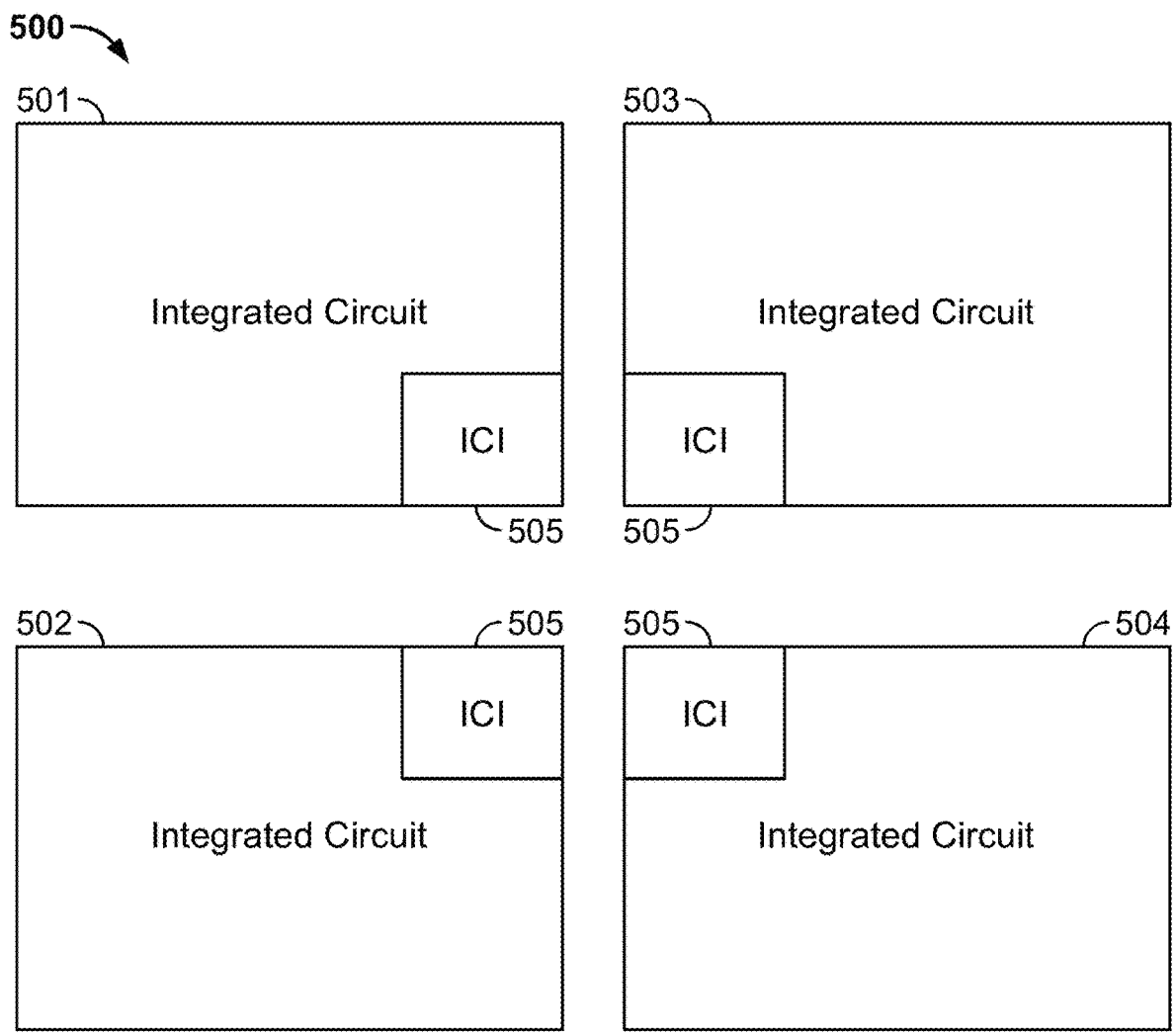
FIG. 5 is a plan view of four integrated circuit chips arranged for use as a four-chip module in accordance with implementations of the subject matter of this disclosure.

A further implementation 500 is shown in FIG. 5. In this implementation, four integrated circuit chips 501, 502, 503, 504 may be formed, with each of integrated circuit chips 501, 502, 503, 504 having an inter-chip interface 505 on a corner, and the integrated circuit chips 501, 502, 503, 504 so that the four inter-chip interfaces 505 face each other. The arrangement shown in FIG. 5 allows the four integrated circuit chips 501, 502, 503, 504 to be used as a single four-chip module or as four single-chip modules, depending on what connector metallizations (not shown) are applied. It also may be possible to use two or three out of the four integrated circuit chips 501, 502, 503, 504 as a dual-chip module or a triple-chip module. If a dual-chip module is formed, the remaining two of the integrated circuit chips 501, 502, 503, 504 can be used as two single-chip modules, or can be used together as a second dual-chip module. If a triple-chip module is formed, the remaining one of integrated circuit chips 501, 502, 503, 504 may be used as a single-chip module.

Figure 6:
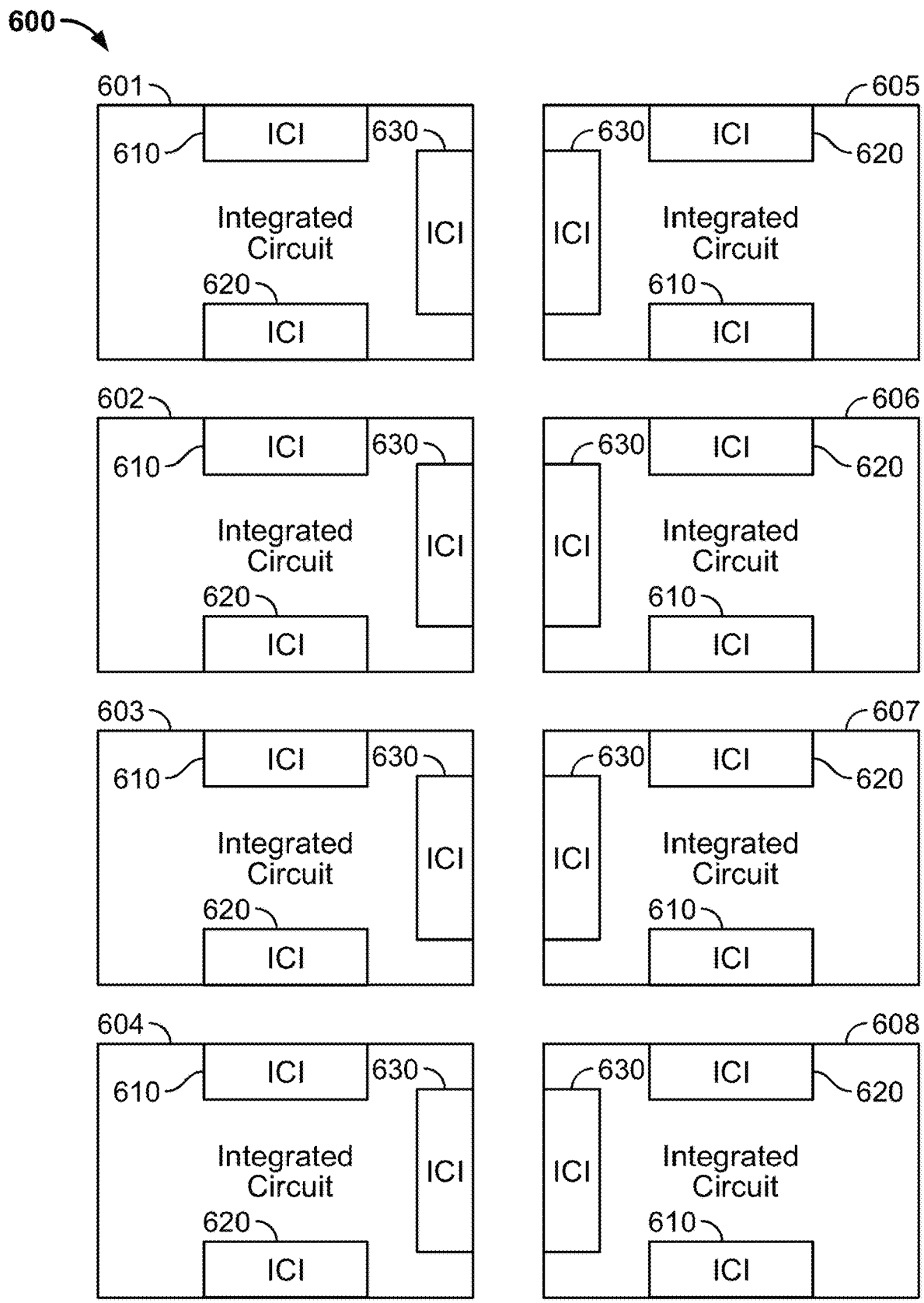
FIG. 6 is a plan view of eight integrated circuit chips arranged for use as an eight-chip module in accordance with implementations of the subject matter of this disclosure.

Further implementations including groups of larger numbers of integrated circuit chips also may be formed in accordance with the subject matter of this disclosure. For example, FIG. 6 shows an arrangement 600 of eight integrated circuit chips 601, 602, 603, 604, 605, 606, 607, 608 that may be used as eight single-chip modules or interconnected into a multi-chip module (e.g., an eight-chip module) in accordance with implementations of the subject matter of this disclosure, depending on what connector metallizations (not shown) are applied. In this implementation, each of integrated circuit chips 601-608 includes three inter-chip interfaces 610, 620, 630. The clock paths from each ICI 610, 620, 630 to the clock tree of the respective one of integrated circuit chips 601-608 should be balanced so that the clock path length from any of ICIs 610, 620, 630 to the functional circuitry of that one of integrated circuit devices 601-608 is the same.

Integrated circuit chips 601-608 are arranged in two columns of four integrated circuit chips. Each of integrated circuit chips 605-608 is rotated 180° relative to each of integrated circuit chips 601-604, but all of integrated circuit chips 601-608 may otherwise be identical. Facing ICIs on neighboring ones of integrated circuit chips 601-608 may be interconnected as described above in connection with other implementations, to form an eight-chip module. As in the case of arrangement 500 of FIG. 5, subsets of the integrated circuit chips 601-608 in arrangement 600 of may be interconnected in smaller modules.

In a variation (not shown) of arrangement 600, integrated circuit chips 601, 604, 605 and 608, in the corners of arrangement 600 may be provided with only two ICIs each. For example, integrated circuit chips 601 and 608 may include only ICIs 620 and 630 (integrated circuit chip 608 would be rotated 180° relative to integrated circuit device 601), while integrated circuit devices 604 and 605 may include only ICIs 610 and 630 (integrated circuit device 605 would be rotated 180° relative to integrated circuit chip 604). Such a variation may allow integrated circuit chips 601, 604, 605 and 608 to be smaller than integrated circuit devices 602, 603, 606 and 607, which would conserve die area, but may sacrifice some of the efficiency of reusing the same layout as integrated circuit chips 602, 603, 606 and 607.

Additional variations of arrangements with multiple chips, each having multiple ICIs, may be possible. Moreover, while each of the illustrations described herein shows one clock being shared between integrated circuit chips, there may be implementations in which two or more clocks are shared between chips. In such an implementation, each inter-chip interface would have connections for an appropriate number of clock circuits, and a corresponding number of connector metallizations would be provided.

Figure 7:
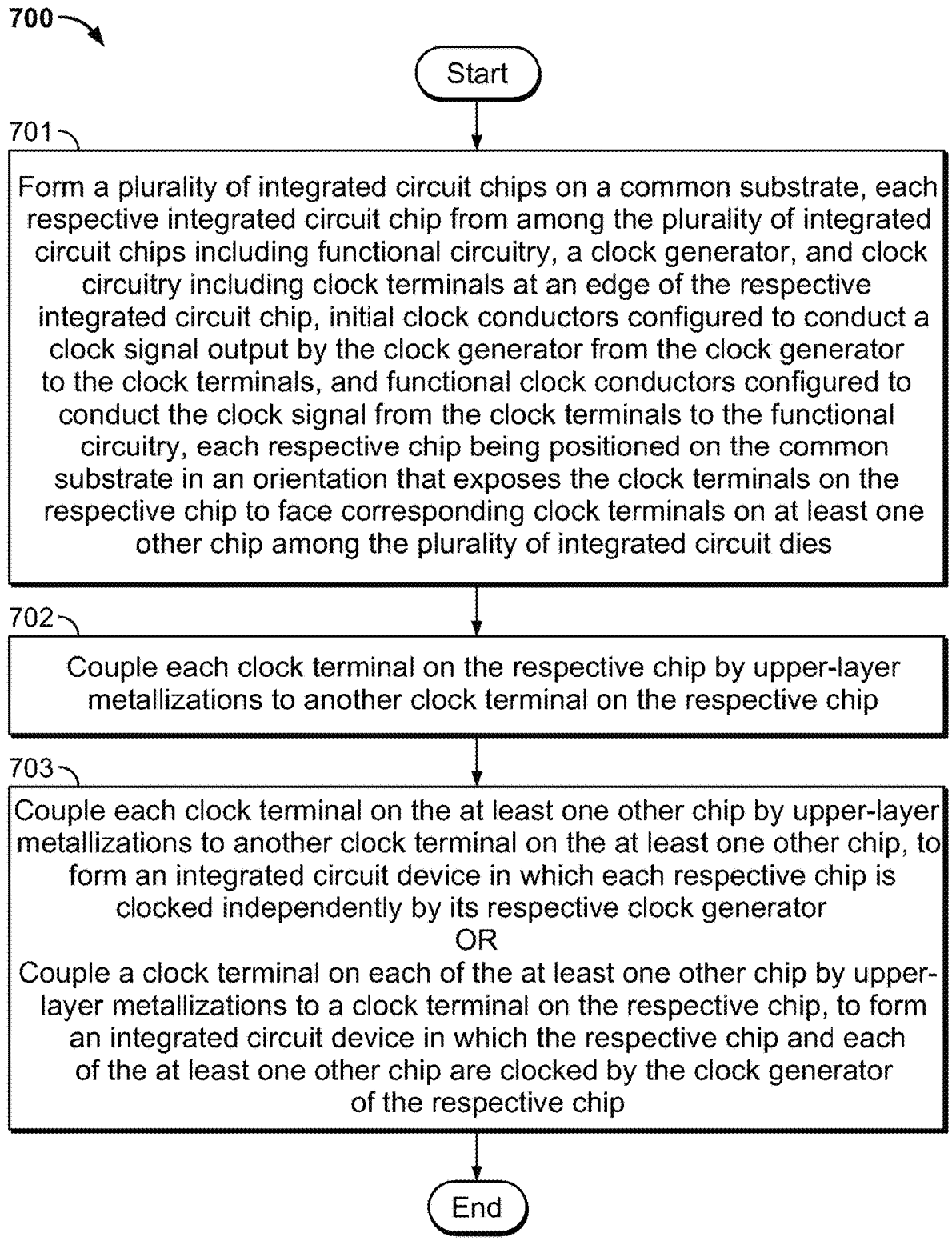
FIG. 7 is a flow diagram illustrating a method in accordance with implementations of the subject matter of this disclosure.

A method 700 according to implementations of the subject matter of this disclosure is diagrammed in FIG. 7. Method 700 begins at 701, where a plurality of integrated circuit chips are formed on a common substrate, each respective integrated circuit chip including functional circuitry, a clock generator, and clock circuitry including clock terminals at an edge of the respective integrated circuit chip, initial clock conductors configured to conduct a clock signal output by the clock generator from the clock generator to the clock terminals, and functional clock conductors configured to conduct the clock signal from the clock terminals to the functional circuitry, each respective chip being located on the common substrate in an orientation that exposes the clock terminals on the respective chip to face corresponding clock terminals on at least one other chip.

At 702, each clock terminal on a respective chip is coupled by upper-layer connector metallizations to another clock terminal on the respective chip. At 703, selectably, each clock terminal on at least one other chip is coupled by upper-layer connector metallizations to another clock terminal on the at least one other chip, to form an integrated circuit device in which each respective chip is clocked independently by its respective clock generator, or a clock terminal on each of the at least one other chip is coupled by upper-layer connector metallizations to a clock terminal on the respective chip, to form an integrated circuit device in which the respective chip and each of the at least one other chip are clocked by the clock generator of the respective chip, and method 700 ends.

Thus it is seen that integrated circuits including an interface for providing clock signals between individual chips in a multi-chip module have been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. An integrated circuit device, comprising:
a plurality of integrated circuit chips located on a common substrate, each respective integrated circuit chip from among the plurality of integrated circuit chips including:
functional circuitry,
a clock generator,
clock circuitry including clock terminals at an edge of the respective integrated circuit chip, the clock signal output by the clock generator being coupled to the clock terminals, and functional clock conductors configured as a balanced clock tree to conduct the clock signal from the clock terminals to the functional circuitry when the respective integrated circuit chip is used as a single chip; and
upper-layer connector metallizations of the integrated circuit device coupling each clock terminal on the one respective integrated circuit chip to another clock terminal on the one respective integrated circuit chip; wherein:
the balanced clock tree of one respective integrated circuit chip is balanced with the balanced clock tree of at least one other respective integrated circuit chip;
each respective integrated circuit chip is located on the common substrate in an orientation that exposes the clock terminals on the one respective integrated circuit chip to face corresponding clock terminals on at least one other respective integrated circuit chip among the plurality of integrated circuit chips;
the upper-layer connector metallizations of the integrated circuit device are further configured to selectably:
(a) couple each clock terminal on the at least one other respective integrated circuit chip to another clock terminal on the at least one other respective integrated circuit chip, whereby each respective integrated circuit chip is clocked independently by its respective clock generator, or
(b) couple a clock terminal on each of the at least one other respective integrated circuit chip to a clock terminal on the one respective integrated circuit chip, whereby the one respective integrated circuit chip and each of the at least one other integrated circuit chip are clocked by the clock generator of the one respective integrated circuit chip; and
when the clock terminals of the one respective integrated circuit chip are coupled to the clock terminals of the at least one other respective integrated circuit chip, the balanced clock tree of the one respective integrated circuit chip and the balanced clock tree of the at least one other respective integrated circuit chip together form a balanced combined clock tree of a multi-chip module with a common clock from the clock generator of the one respective integrated circuit chip.

2. The integrated circuit device of claim 1 wherein:
the clock terminals are located at a physical edge of the respective integrated circuit chip; and
no portion of the functional circuitry is present between the clock terminals and the physical edge of the respective integrated circuit chip.

3. The integrated circuit device of claim 1 wherein:
each balanced clock tree includes at least one clock buffer; and
each of the at least one other respective integrated circuit chip is separated from the one respective integrated circuit chip by a respective separation distance that exceeds a gap distance between respective clock terminals on the one respective integrated circuit chip by an amount that contributes to clock jitter, between clock signals on the one respective integrated circuit chip and clock signals on each of the at least one other respective integrated circuit chip, to a degree within a buffering capacity of the at least one clock buffer when the connector metallizations are configured to couple the clock terminal on each of the at least one other respective integrated circuit chip to the clock terminal on the one respective integrated circuit chip, and the one respective integrated circuit chip and each of the at least one other respective integrated circuit chip are clocked by the clock generator of the one respective integrated circuit chip.

4. The integrated circuit device of claim 3 wherein the separation distance is about 80 μm.

5. The integrated circuit device of claim 1 wherein the at least one other respective integrated circuit chip is exactly one other respective integrated circuit chip, the one respective integrated circuit chip and the one other respective integrated circuit chip forming a group of two integrated circuit chips configurable by the connector metallizations as one of (a) two single-chip modules, and (b) one dual-chip module.

6. The integrated circuit device of claim 1 wherein the at least one other respective integrated circuit chip is a plurality of other respective integrated circuit chips, the one respective integrated circuit chip and the plurality of other respective integrated circuit chips forming a group of integrated circuit chips configurable by the connector metallizations as one of (a) a plurality of single-chip modules, and (b) one multi-chip module.

7. The integrated circuit device of claim 6 wherein:
the plurality of other respective integrated circuit chips comprises three other respective integrated circuit chips; and
the one respective integrated circuit chip and the three other respective integrated circuit chips are identical and form a group of integrated circuit chips configurable by the connector metallizations as one of (a) four single-chip modules, and (b) one four-chip module.

8. The integrated circuit device of claim 6 wherein:
the plurality of other respective integrated circuit chips comprises at least seven other respective integrated circuit chips;
each integrated circuit chip of the one respective chip and the plurality of other respective integrated circuit chips has a plurality of sets of clock terminals, each set of clock terminals on one particular integrated circuit chip being on a different edge of the one particular integrated circuit chip; and
the one respective chip and the plurality of other respective integrated circuit chips form a group of integrated circuit chips configurable by the connector metallizations as one of (a) a plurality of single-chip modules, and (b) one multi-chip module.

9. The integrated circuit device of claim 8 wherein:
all integrated circuit chips in the one respective chip and the at least seven other respective integrated circuit chips are identical, having an identical number of sets of clock terminals.

10. The integrated circuit device of claim 8 wherein:
each integrated circuit chip in a first subset of the one respective chip and the at least seven other respective integrated circuit chips has a first number of sets of clock terminals; and
each integrated circuit chip in a second subset of the one respective chip and the at least seven other respective integrated circuit chips has a second number of sets of clock terminals different from the first number of sets of clock terminals.

11. An intermediate integrated circuit product, comprising:
a plurality of integrated circuit chips located on a common substrate, each respective integrated circuit chip from among the plurality of integrated circuit chips including:
functional circuitry,
a clock generator,
clock circuitry including clock terminals at an edge of the respective integrated circuit chip, the clock signal output by the clock generator being coupled to the clock terminals, and functional clock conductors configured as a balanced clock tree to conduct the clock signal from the clock terminals to the functional circuitry;
wherein:
the balanced clock tree of one respective integrated circuit chip is balanced with the balanced clock tree of at least one other respective integrated circuit chip;
each respective integrated circuit chip is located on the common substrate in an orientation that exposes the clock terminals on the respective integrated circuit chip to face corresponding clock terminals on at least one other respective integrated circuit chip among the plurality of integrated circuit chips; the intermediate integrated circuit product being configured to:
have each clock terminal on the one respective integrated circuit chip coupled by upper-layer connector metallizations to another clock terminal on the one respective integrated circuit chip, and to selectably:
(a) have each clock terminal on the at least one other respective integrated circuit chip be coupled by upper-layer connector metallizations to another clock terminal on the at least one other integrated circuit chip, to form an integrated circuit device in which each respective integrated circuit chip is clocked independently by its respective clock generator; or
(b) have a clock terminal on each of the at least one other respective integrated circuit chip coupled by upper-layer connector metallizations to a clock terminal on the one respective integrated circuit chip, to form an integrated circuit device in which the one respective integrated circuit chip and each of the at least one other respective integrated circuit chip are clocked by the clock generator of the respective integrated circuit chip, the balanced clock tree of the one respective integrated circuit chip and the balanced clock tree of the at least one other respective integrated circuit chip forming a balanced combined clock tree of a multi-chip module with a common clock from the clock generator of the at least one respective integrated circuit chip.

12. The intermediate integrated circuit product of claim 11 wherein:
the clock terminals are located at a physical edge of the respective integrated circuit chip; and
no portion of the functional circuitry is present between the clock terminals and the physical edge of the respective integrated circuit chip.

13. The intermediate integrated circuit product of claim 11 wherein:
each balanced clock tree includes at least one clock buffer; and
each of the at least one other integrated circuit chip is separated from the respective integrated circuit chip by a respective separation distance that exceeds a gap distance between respective clock terminals on the respective integrated circuit chip by an amount that contributes to clock jitter, between clock signals on the respective integrated circuit chip and clock signals on each of the at least one other respective integrated circuit chip, to a degree within a buffering capacity of the at least one clock buffer when the connector metallizations are configured to couple the clock terminal on each of the at least one other respective integrated circuit chip to the clock terminal on the one respective integrated circuit chip, and the one respective integrated circuit chip and each of the at least one other respective integrated circuit chip are clocked by the clock generator of the one respective integrated circuit chip.

14. The intermediate integrated circuit product of claim 13 wherein the separation distance is about 80 μm.

15. The intermediate integrated circuit product of claim 11 wherein the at least one other respective integrated circuit chip is exactly one other respective integrated circuit chip, the one respective integrated circuit chip and the one other respective integrated circuit chip forming a group of two integrated circuit chips configurable by the connector metallizations as one of (a) two single-chip modules, and (b) one dual-chip module.

16. The intermediate integrated circuit product of claim 11 wherein the at least one other respective integrated circuit chip is a plurality of other respective integrated circuit chips, the one respective integrated circuit chip and the plurality of other respective integrated circuit chips forming a group of integrated circuit chips configurable by the connector metallizations as one of (a) a plurality of single-chip modules, and (b) one multi-chip module.

17. The intermediate integrated circuit product of claim 16 wherein:
the plurality of other respective integrated circuit chips comprises three other respective integrated circuit chips;
the one respective integrated circuit chip and the three other respective integrated circuit chips are identical and form a group of respective integrated circuit chips configurable by the connector metallizations as one of (a) four single-chip modules, and (b) one four-chip module.

18. The intermediate integrated circuit product of claim 16 wherein:
the plurality of other respective integrated circuit chips comprises at least seven other respective integrated circuit chips;
each integrated circuit chip of the one respective integrated circuit chip and the plurality of other respective integrated circuit chips has a plurality of sets of clock terminals, each set of clock terminals on one particular integrated circuit chip being on a different edge of the one particular integrated circuit chip; and
the one respective integrated circuit chip and the plurality of other respective integrated circuit chips form a group of integrated circuit chips configurable by the connector metallizations as one of (a) a plurality of single-chip modules, and (b) one multi-chip module.

19. The intermediate integrated circuit product of claim 18 wherein:
all integrated circuit chips in the one respective integrated circuit chip and the at least seven other respective integrated circuit chips are identical, having an identical number of sets of clock terminals.

20. The intermediate integrated circuit product of claim 18 wherein:
each integrated circuit chip in a first subset of the one respective integrated circuit chip and the at least seven other respective integrated circuit chips has a first number of sets of clock terminals; and
each integrated circuit chip in a second subset of the one respective integrated circuit chip and the at least seven other respective integrated circuit chips has a second number of sets of clock terminals different from the first number of sets of clock terminals.

21. A method of fabricating an integrated circuit device, the method comprising:
forming a plurality of integrated circuit chips on a common substrate, each respective integrated circuit chip from among the plurality of integrated circuit chips including:
functional circuitry,
a clock generator, and
clock circuitry including clock terminals at an edge of the respective integrated circuit chip, the clock signal output by the clock generator being coupled to the clock terminals, and functional clock conductors configured as a balanced clock tree to conduct the clock signal from the clock terminals to the functional circuitry when the respective integrated circuit chip is used as a single chip, wherein:
the balanced clock tree of one respective integrated circuit chip is balanced with the balanced clock tree of at least one other respective integrated circuit chip, and
each respective integrated circuit chip is positioned on the common substrate in an orientation that exposes the clock terminals on the respective chip to face corresponding clock terminals on at least one other respective chip among the plurality of integrated circuit chips;
coupling each clock terminal on the one respective integrated circuit chip by upper-layer connector metallizations to another clock terminal on the one respective integrated circuit chip; and selectably:
(a) coupling each clock terminal on the at least one other respective integrated circuit chip by upper-layer connector metallizations to another clock terminal on the at least one other respective integrated circuit chip, to form an integrated circuit device in which each respective integrated circuit chip is clocked independently by its respective clock generator, or
(b) coupling a clock terminal on each of the at least one other respective integrated circuit chip by upper-layer connector metallizations to a clock terminal on the respective integrated chip, to form an integrated circuit device in which the respective integrated circuit chip and each of the at least one other respective integrated circuit chip are clocked by the clock generator of the respective chip, and the balanced clock tree of the one respective integrated circuit chip and the balanced clock tree of the at least one other respective integrated circuit chip form a balanced combined clock tree of a multi-chip module with a common clock from the clock generator of the at least one respective integrated circuit chip.

22. The method of fabricating an integrated circuit device according to claim 21 comprising:
forming the clock terminals at a physical edge of the respective integrated circuit chip; and
forming the clock circuitry with no portion of the functional circuitry between the clock terminals and the physical edge of the respective integrated circuit chip.

23. The method of fabricating an integrated circuit device according to claim 21, further comprising separating each of the at least one other respective integrated circuit chip from the one respective integrated circuit chip by a separation distance that exceeds a gap distance between respective clock terminals on the one respective integrated circuit chip by an amount that contributes to clock jitter, between clock signals on the one respective integrated circuit chip and clock signals on each of the at least one other respective integrated circuit chip, to a degree within a buffering capacity of the at least one clock buffer when clock terminal on each of the at least one other respective integrated circuit chip are coupled by the upper-layer connector metallizations to the clock terminal on the respective integrated circuit chip.

24. The method of fabricating an integrated circuit device according to claim 23 wherein separating each of the at least one other respective integrated circuit chip from the one respective integrated circuit chip comprises separating each of the at least one other respective integrated circuit chip from the one respective integrated circuit chip by about 80 μm.

25. The method of fabricating an integrated circuit device according to claim 21 wherein forming a plurality of integrated circuit chips comprises forming respective pairs of integrated circuit chips configurable by the connector metallizations as one of (a) two single-chip modules, and (b) one dual-chip module.

26. The method of fabricating an integrated circuit device according to claim 21 wherein forming a plurality of integrated circuit chips comprises forming the one respective integrated circuit chip and a plurality of other respective integrated circuit chips as a group of integrated circuit chips configurable by the connector metallizations as one of (a) a plurality of single-chip modules, and (b) one multi-chip module.

27. The method of fabricating an integrated circuit device according to claim 26 wherein forming the one respective integrated circuit chip and the plurality of other respective integrated circuit chips comprises forming the one respective integrated circuit chip and three other respective integrated circuit chips, the one respective integrated circuit chip and the three other respective integrated circuit chips being identical and forming a group of integrated circuit chips configurable by the connector metallizations as one of (a) four single-chip modules, and (b) one four-chip module.

28. The method of fabricating an integrated circuit device according to claim 26 wherein forming the one respective integrated circuit chip and the plurality of other respective integrated circuit chips comprises forming the one respective integrated circuit chip and at least seven other respective integrated circuit chips, each integrated circuit chip of the one respective integrated circuit chip and the plurality of other respective integrated circuit chips having a plurality of sets of clock terminals, each set of clock terminals on one particular integrated circuit chip being on a different edge of the one particular integrated circuit chip, and the one respective integrated circuit chip and the at least seven other respective integrated circuit chips forming a group of chips configurable by the connector metallizations as one of (a) a plurality of single-chip modules, and (b) one multi-chip module.

29. The method of fabricating an integrated circuit device according to claim 28 comprising forming all integrated circuit chips in the one respective integrated circuit chip and the at least seven other respective integrated circuit chips identically, with an identical number of sets of clock terminals.

30. The method of fabricating an integrated circuit device according to claim 28 comprising:
 forming each integrated circuit chip in a first subset of the one respective integrated circuit chip and the at least seven other respective integrated circuit chips with a first number of sets of clock terminals; and
 forming each integrated circuit chip in a second subset of the one respective integrated circuit chip and the at least seven other respective integrated circuit chips with a second number of sets of clock terminals different from the first number of sets of clock terminals.

* * * * *